United States Patent
Myong

(10) Patent No.: US 8,916,771 B2
(45) Date of Patent: Dec. 23, 2014

(54) PHOTOVOLTAIC DEVICE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 0 days.

(21) Appl. No.: 12/872,891

(22) Filed: Aug. 31, 2010

(65) Prior Publication Data

US 2011/0056538 A1     Mar. 10, 2011

(30) Foreign Application Priority Data

Sep. 4, 2009 (KR) .......... 10-2009-0083299

(51) Int. Cl.
| | |
|---|---|
| H01L 31/032 | (2006.01) |
| H01L 27/142 | (2014.01) |
| H01L 31/076 | (2012.01) |
| H01L 31/0216 | (2014.01) |
| H01L 31/052 | (2014.01) |

(52) U.S. Cl.
CPC .......... H01L 31/076 (2013.01); H01L 27/1423 (2013.01); Y02E 10/52 (2013.01); Y02E 10/548 (2013.01); H01L 31/02168 (2013.01); H01L 31/0527 (2013.01)
USPC ............. 136/256; 136/255; 136/252; 438/72

(58) Field of Classification Search
USPC ............... 136/256, 255, 252; 438/72
See application file for complete search history.

(56) References Cited

U.S. PATENT DOCUMENTS

| | | | | |
|---|---|---|---|---|
| 4,387,265 | A * | 6/1983 | Dalal | 136/249 |
| 4,536,607 | A * | 8/1985 | Wiesmann | 136/249 |
| 4,680,422 | A * | 7/1987 | Stanbery | 136/249 |
| 4,686,323 | A * | 8/1987 | Biter et al. | 136/249 |
| 4,907,052 | A * | 3/1990 | Takada et al. | 257/458 |
| 5,021,100 | A * | 6/1991 | Ishihara et al. | 136/249 |
| 5,127,964 | A * | 7/1992 | Hamakawa et al. | 136/256 |
| 5,990,416 | A * | 11/1999 | Windisch et al. | 136/255 |
| 6,117,366 | A * | 9/2000 | Park et al. | 252/512 |
| 6,207,886 | B1 * | 3/2001 | Kusakabe et al. | 136/201 |
| 7,189,917 | B2 * | 3/2007 | Okada et al. | 136/255 |
| 7,375,370 | B2 * | 5/2008 | Forrest et al. | 257/40 |

(Continued)

FOREIGN PATENT DOCUMENTS

| | | |
|---|---|---|
| CN | 101445332 | 6/2009 |
| EP | 163519 | 5/2006 |

(Continued)

OTHER PUBLICATIONS

Banerjee et al., "Reduction of Thickness of N-Type Microcrystalline Hydrogenated Silicon Oxide Film Using Different Types of Seed Layer", Jpn. J. Appl. Phys. vol. 41 (2002) pp. L787-L789.*

(Continued)

*Primary Examiner* — Golam Mowla
(74) *Attorney, Agent, or Firm* — H.C. Park & Associates, PLC

(57) ABSTRACT

Disclosed is a method for manufacturing a photovoltaic device. The method includes: forming a first electrode on a substrate; forming a first unit cell converting light into electricity on the first electrode; forming an intermediate reflector on the first unit cell, the intermediate reflector including metallic nanoparticles arranged therein; and forming a second unit cell converting light into electricity on the intermediate reflector.

19 Claims, 2 Drawing Sheets

(56) References Cited

U.S. PATENT DOCUMENTS

| | | | |
|---|---|---|---|
| 7,550,665 B2 * | 6/2009 | Sasaki et al. | 136/246 |
| 2002/0050289 A1 * | 5/2002 | Wada et al. | 136/256 |
| 2004/0177878 A1 * | 9/2004 | Maruyama | 136/256 |
| 2006/0032529 A1 | 2/2006 | Rand et al. | |
| 2006/0174935 A1 * | 8/2006 | Sawada et al. | 136/261 |
| 2006/0249197 A1 * | 11/2006 | Shima et al. | 136/246 |
| 2009/0014066 A1 * | 1/2009 | Suezaki et al. | 136/258 |
| 2009/0293936 A1 * | 12/2009 | Myong | 136/246 |

FOREIGN PATENT DOCUMENTS

| | | |
|---|---|---|
| JP | 2003298088 | 10/2003 |
| KR | 1020070068485 | 8/2007 |
| KR | 100876613 | 12/2008 |
| WO | WO2006017539 | 2/2006 |

OTHER PUBLICATIONS

European Office Action issued on Apr. 23, 2013 in European Patent Application No. 10 175 163.4.

Fahr Stephan et al., "Metallic nanoparticles as intermediate reflectors in tandem solar cells", Applied Physics Letters, AIP, American Institute of Physics, vol. 95, No. 121105, Sep. 22, 2009, pp. 121105-1-121105-3, Melville, NY, US.

Yakimov A et al., "High photovoltage multiple-heterojunction organic solar cells incorporating interfacial metallic nanoclusters", Applied Physics Letters, AIP, American Institute of Physics, vol. 80, No. 9, Mar. 4, 2002, pp. 1667-1669, Melville, NY, US.

* cited by examiner

PHOTOVOLTAIC DEVICE AND METHOD FOR MANUFACTURING THE SAME

CROSS REFERENCE TO RELATED APPLICATION

This application claims the benefit of Korean Patent Application No. 10-2009-0083299 filed on Sep. 4, 2009, the entirety of which is hereby incorporated by reference.

FIELD OF THE INVENTION

This embodiment relates to a photovoltaic device and a method for manufacturing the same.

BACKGROUND OF THE INVENTION

Recently, because of high oil prices and the global warming phenomenon based on a large amount of $CO_2$ emissions, energy is becoming the most important issue in determining the future life of mankind. Even though many technologies using renewable energy sources including wind force, bio-fuels, hydrogen/fuel cells and the like have been developed, a photovoltaic device using sunlight is in the spotlight. This is because solar energy, the origin of all energies, is an almost infinite clean energy source.

The sunlight incident on the surface of the earth has an electric power of 120,000 TW. Thus, theoretically, a photovoltaic device having a photoelectric conversion efficiency of 10% and covering only 0.16% of the land surface of the earth is capable of generating 20 TW of electric power, which is twice as much as the amount of energy globally consumed during one year.

Practically, the world photovoltaic market has grown by almost a 40% annual growth rate for the last ten years. Now, a bulk-type silicon photovoltaic device occupies 90% of the photovoltaic device market share. The bulk-type silicon photovoltaic device includes a single-crystalline silicon photovoltaic device and a multi-crystalline or a poly-crystalline silicon photovoltaic device and the like. However, productivity of a solar-grade silicon wafer which is the main material of the photovoltaic device is not able to fill the explosive demand thereof, so the solar-grade silicon water is globally in short supply. Therefore, this shortage of the solar-grade silicon wafer is a huge threatening factor in reducing the manufacturing cost of a photovoltaic device.

Contrary to this, a thin-film silicon photovoltaic device including a light absorbing layer based on a hydrogenated amorphous silicon (a-Si:H) allows a reduction of thickness of a silicon layer equal to or less than $\frac{1}{100}$ as large as that of a silicon wafer of the bulk-type silicon photovoltaic device. Also, it makes possible to manufacture a large area photovoltaic device at a lower cost.

Meanwhile, a single-junction thin-film silicon photovoltaic device is limited in its achievable performance. Accordingly, a double junction thin-film silicon photovoltaic device or a triple junction thin-film silicon photovoltaic device having a plurality of stacked unit cells has been developed, pursuing high stabilized efficiency.

The double junction or the triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells.

Regarding the tandem-type photovoltaic device, research is being devoted to an intermediate reflector which is capable of improving efficiency by enhancing internal light reflection between the unit cells.

SUMMARY OF THE INVENTION

One aspect of this invention is a method for manufacturing a photovoltaic device. The method comprising: forming a first electrode on a substrate; forming a first unit cell converting light into electricity on the first electrode; forming an intermediate reflector on the first unit cell, the intermediate reflector including metallic nanoparticles arranged therein; and forming a second unit cell converting light into electricity on the intermediate reflector.

Another aspect of this invention is a photovoltaic device. The photovoltaic device includes: a first electrode placed on a substrate; a first unit cell placed on the first electrode and converting light into electricity; an intermediate reflector placed on the first unit cell and including metallic nanoparticles arranged therein; and a second unit cell placed on the intermediate reflector and converting light into electricity.

DETAILED DESCRIPTION OF THE INVENTION

A photovoltaic device according to an embodiment of the present invention and a method for manufacturing the photovoltaic device will be described with reference to the drawings.

A photovoltaic device may include a double junction structure and a triple junction structure and the like. In FIG. 1, a photovoltaic device having the double junction structure will he described as an example.

FIG. 1a to 1h show a method for manufacturing a photovoltaic device according to the embodiment of the present invention.

Figure 1A:
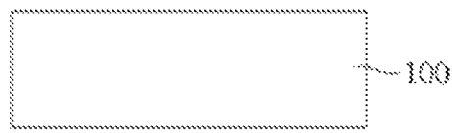
FIGS. 1a to 1h show a method for manufacturing a photovoltaic device according to the embodiment of the present invention.

As shown in FIG. 1a, first, substrate 100 is provided. The substrate 100 may include an insulating transparent substrate and an insulating opaque substrate. The insulating transparent substrate may be included in a p-i-n type photovoltaic device. The insulating opaque substrate may be included in an n-i-p type photovoltaic device. The p-i-n type photovoltaic device and the n-i-p type photovoltaic device will be described later in detail.

Figure 1B:
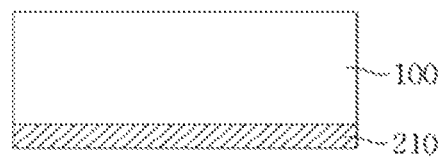

As shown in FIG. 1b, a first electrode 210 is formed on the substrate 100. In the embodiment of the present invention, the first electrode 210 may be formed by using chemical vapor deposition (CVD) method and comprises a transparent conductive oxide (TCO) such as Tin dioxide ($SnO_2$) and Zinc Oxide (ZnO) and the like. In the case of the n-i-p type photovoltaic device, the first electrode 210 may include opaque conductive material.

Figure 1C:
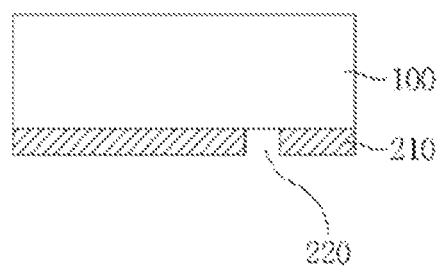

As shown in FIG. 1c, the first electrode 210 is scribed by irradiating a laser beam from the side of the first electrode 210 or the substrate 100. A first separation groove 220 is hereby formed in the first electrode 210. That is, since the first separation groove 220 penetrates through the first electrode 210, short circuits between the adjacent first electrodes 210 are avoided.

Figure 1D:
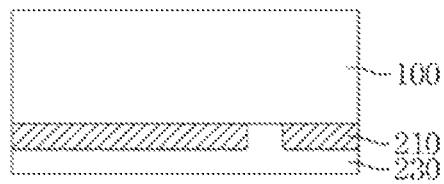

As shown in FIG. 1d, a first unit cell 230 is formed on the first electrode 210 by using CVD method. Here, the first unit cell 230 converts light into electricity and includes a p-type semiconductor layer, an intrinsic semiconductor layer and an n-type semiconductor layer. After source gas including silicon such as $SiH_4$ and doping gas including group 3 elements such as $B_2H_6$ are injected together into a reaction chamber in order to form the p-type semiconductor layer, the p-type semiconductor layer is formed by using CVD method. The intrinsic semiconductor layer is formed by using CVD method after source gas including silicon is injected into a reaction chamber. Doping gas such as $PH_3$ including group 5 elements and source gas including silicon are injected together, and then the n-type semiconductor layer is formed by using CVD method.

According to the order of forming each layer, a p-i-n type unit cell in which the p-type semiconductor layer, the intrinsic semiconductor layer and the n-type semiconductor layer are sequentially stacked in the order specified or a n-i-p type unit cell in which the n-type semiconductor layer, the intrinsic semiconductor layer and the p-type semiconductor layer are sequentially stacked in the order specified may be formed on the first electrode 210.

Figure 1E:
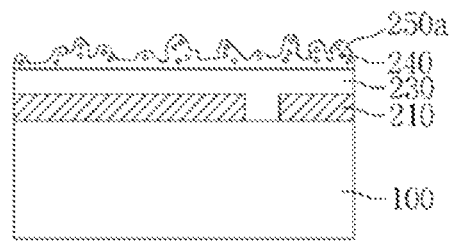

As shown in FIG. 1e, reflective metallic nanoparticles are arranged on the first electrode 210. When light is incident on the metallic nanoparticles, surface plasmon resonance occurs and so light intensity can he enhanced. The reason will be described later in detail that the efficiency of the photovoltaic device is increased due to the surface plasmon resonance by the metallic nanoparticles 240.

The metallic nanoparticles are arranged by using either a vacuum deposition method, for example, a chemical vapor deposition method and a sputtering method, etc., or an arrangement method at a room temperature, for example, a spray method and a spin coating method, etc. Accordingly, an intermediate reflector 250a including the metallic nanoparticles is formed. The spray method for arranging the metallic nanoparticles is performed by spraying volatile liquid such as methanol, ethanol and isopropyl alcohol, etc., with a sprayer.

Figure 1F:
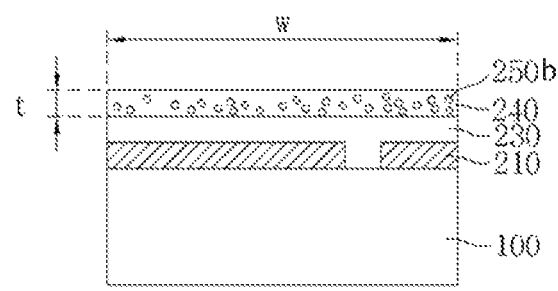

While the metallic nanoparticles may be arranged as shown in FIG. 1e, FIG. 1f shows that the metallic nanoparticles are embedded into a metal oxide film, an oxide film, a nitride film or a carbon alloy so that an intermediate reflector 250b including the metallic nanoparticles, and the metal oxide film, the oxide film, the nitride film or the carbon alloy: The intermediate reflector 250b shown in FIG. 1f may be formed by arranging the metallic nanoparticles on the first unit cell 230, and then covering the metallic nanoparticles with a metal oxide film, an oxide film, a nitride film or a carbon alloy through vacuum deposition.

The intermediate reflector 250b may be also formed by forming a metal oxide film, an oxide film, a nitride film or a carbon alloy on the first unit cell 230 through vacuum deposition, arranging the metallic nanoparticles on the metal oxide film, the oxide film, the nitride film or the carbon alloy, and then covering the metallic nanoparticles with another metal oxide film, another oxide film, another nitride film or another carbon alloy through vacuum deposition. As a result, the metallic nanoparticles can be stably arranged in the metal oxide film, the oxide film, the nitride film or the carbon alloy.

The metallic nanoparticles may include at least one of Gold (Au), Silver (Ag), Aluminum (Al), Platinum (Pt), Copper (Cu), Nickel (Ni), Chromium (Cr), Zinc (Zn), Titanium (Ti) and Tin (Sn). The metallic nanoparticles may include metallic oxide such as Zinc Oxide (ZnO), Indium Tin Oxide (ITO), Indium Zinc Oxide (IZO), Tin Dioxide ($SnO_2$), Aluminum Oxide ($Al_2O_3$) or Magnesium Oxide (MgO).

Figure 1G:
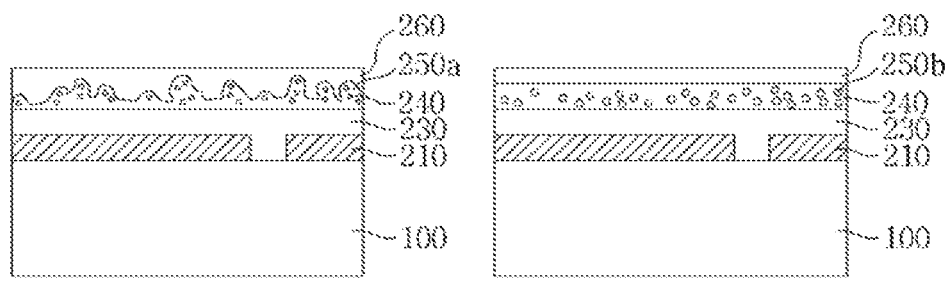

As shown in FIG. 1g, a second unit cell 260 converting light into electricity is formed on the intermediate reflector 250a and 250b. The second unit cell 260 includes a p-type semiconductor layer, an intrinsic semiconductor layer and an n-type semiconductor layer. According to the order of forming each layer, the second unit cell 260 on the intermediate reflector 250a and 250b may be either of a p-i-n type unit cell in which the p-type semiconductor layer, the intrinsic semiconductor layer and the n-type semiconductor layer are sequentially stacked in the order specified or a n-i-p type unit cell in which the n-type semiconductor layer, the intrinsic semiconductor layer and the p-type semiconductor layer are sequentially stacked in the order specified.

In the case of that the intermediate reflector 250b shown in FIG. 1f is formed, uniformity of the p-type semiconductor layer of the p-i-n type second unit cell 260 or the n-type semiconductor layer of the n-i-p type unit cell 260, which is contacting with the intermediate reflector 250b, may be superior to that of the p-type semiconductor layer or the s-type semiconductor layer of the second unit cell 260 formed on the intermediate reflector 250a of FIG. 1e.

The refractive index of the intermediate reflector 250b may be equal to or more than 1.7 and equal to or less than 2.2. When the refractive index of the intermediate reflector 250b is equal to or more than 1.7, the conductivity thereof increases. Thus, a fill factor (FF) of a multi junction photovoltaic device is improved and so efficiency becomes higher. When the refractive index of the intermediate reflector 250b is equal to or less than 2.2, light having a wavelength from 500 nm to 700 nm is easily reflected so that the short circuit current of a unit cell which is closest to the light incident side, that is, a unit cell on which light is first incident increases. As a result, efficiency is enhanced.

Figure 1H:
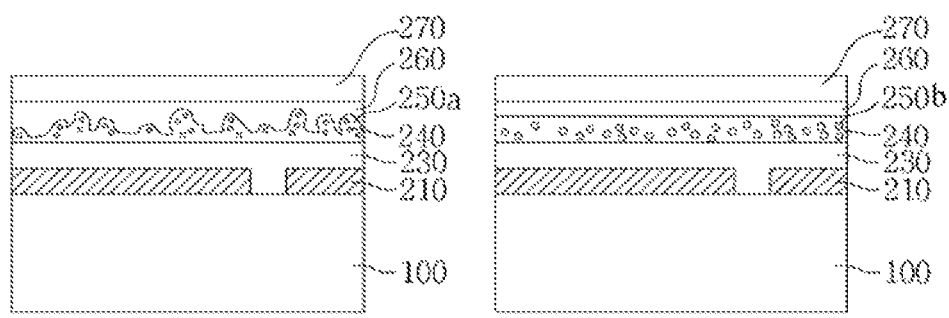

As shown in FIG. 1h, a second electrode 270 is formed on the second unit cell 260. As described above, the metallic nanoparticles of the intermediate reflectors 250a and 250b according to the embodiment of the present invention may enhance light intensity through surface plasmon resonance. That is, due to the surface plasmon of the metallic nanoparticles, light with a wavelength equal to or greater than 800 nm is amplified around the metallic nanoparticles by an enhanced electromagnetic field.

In a photovoltaic device having a tandem structure, a unit cell which is closest to the light incident side generally absorbs light with a short wavelength. A unit cell which is farthest from the light incident side generally absorbs light with a long wavelength. Therefore, since the metallic nanoparticles enhance the intensity of light with a long wavelength, the amount of current generated by the unit cell which is farthest from the light incident side may be increased even in the case of that the intrinsic semiconductor layer of the unit cell does not become thicker.

In the embodiment of the present invention, regarding the p-i-n type photovoltaic device, a unit cell which is closest to the light incident side corresponds to the first unit cell 230 and a unit cell which is farthest from the light incident side corresponds to the second unit cell 260. In the embodiment of the present invention, regarding the n-i-p type photovoltaic device, a unit cell which is closest to the light incident side corresponds to the second unit cell 260 and a unit cell which is farthest from the light incident side corresponds to the first unit cell 230.

Also, the metallic nanoparticles reflect a part of the incident light back to the unit cell on which light is first incident, and so it makes current generation of the unit cell on which light is first incident increase.

In order to generate the surface plasmon resonance, the metallic nanoparticles may have a diameter equal to or more than 5 nm and equal to or less than 100 nm. Further, in order to increase the intensity of light with a wavelength equal to or greater than 800 nm, the diameter of the metallic nanoparticles may be equal to or more than 20 nm and equal to or less than 60 nm.

As mentioned above, the intermediate reflector 250b according to the embodiment of the present invention may include a metal oxide film, an oxide film, a nitride film or a carbon alloy in which metallic nanoparticles are embedded. Since the metallic nanoparticles are dispersed in the metal oxide film, the oxide film, the nitride film or the carbon alloy, electric current can hardly flow through the metallic nanoparticles. As a result, it is possible to avoid a leakage current through the intermediate reflector 250b.

Meanwhile, so as to increase the vertical conductivity between the first unit cell 230 and the second unit cell 260, n-type impurities such as Phosphine ($PH_3$) or p-type impurities such as Boron (B) may be doped in the metal oxide film, the oxide film, the nitride film or the carbon alloy of the intermediate reflector 250b. The width (w) of the intermediate reflector 250b is much greater than the thickness (t) of the intermediate reflector 250b. Therefore, when the n-type impurities or the p-type impurities are doped, the vertical conductivity is improved. However, a horizontal conductivity thereof is not so high that a leakage current can flow through the intermediate reflector 250b.

Accordingly, the intermediate reflector 250b may include hydrogenated n-type silicon oxide (n-SiO:H), hydrogenated n-type silicon carbide (n-SiC:H) or hydrogenated n-type silicon nitride (n-SiN:H). Also, the intermediate reflector 250b may include hydrogenated type nanocrystalline silicon oxide (n-nc-SiO:H), hydrogenated n-type nanocrystalline silicon carbide (n-nc-SiC:H) or hydrogenated n-type nanocrystalline silicon nitride (n-nc-SiN:H), which has the vertical conductivity superior to that of an amorphous silicon based material.

The thickness of the intermediate reflector 250b may be equal to or more than 30 nm and equal to or less than 2000 nm. To match a refractive index between the intermediate reflector 250b and the unit cell on which light is first incident, the thickness of the intermediate reflector 250h may be equal to or more than 30 nm. When the thickness of the intermediate reflector 250b is equal to or less than 2000 nm, the light is prevented from being excessively absorbed by the intermediate reflector 250b. When the thickness of the intermediate reflector 250b is equal to or more than 50 nm and equal to or less than 100 nm, the refractive index matching is easily achieved and light is prevented from being excessively absorbed.

A plane fill factor of the metallic nanoparticles may be equal to or more than 0.1% and equal to or less than 10%. The plane till factor corresponds to a ratio of an area that the metallic nanoparticles occupy to the plane unit area of the intermediate reflector 250b. The plane fill factor of the metallic nanoparticles may be equal to or more than 0.1% so as to generate the surface plasmon resonance. The plane till factor of the metallic nanoparticles may he equal to or less than 10% so as to prevent the amount of light which the metallic nanoparticles reflect or absorb from being excessively increased. When the plane fill factor of the metallic nanoparticles is equal to or more than 0.2% and equal to or less than 0.5%, the surface plasmon resonance is more easily generated.

Meanwhile, the photovoltaic device according to the embodiments of the present invention includes the intermediate reflector 250a and 250b so as to increase the efficiency of a tandem structure including a plurality of the unit cells. It is possible to provide even better efficiency by controlling the electric currents of the plurality of the unit cells in addition to introducing the intermediate reflector 250a and 250b.

In general, the operating temperature of the photovoltaic device is an important factor in designing current matching among the plurality of the unit cells of the photovoltaic device having a tandem structure.

For example, a photovoltaic device installed in a region having high temperature or strong ultraviolet radiation is designed such that short circuit current of the photovoltaic device is determined by short circuit current of the unit cell which is closest to the light incident side among the unit cells of the photovoltaic device. This is because the photovoltaic device having its short circuit current determined by the short circuit current of the unit cell which is closest to the light incident side has low temperature coefficient (i.e., an efficiency degradation rate of the photovoltaic device according to temperature rise by 1° C.). That is, the temperature rise of the photovoltaic device has small influence on the efficiency degradation thereof.

On the other hand, a photovoltaic device installed in a region having low temperature or small amount of ultraviolet radiation is designed such that short circuit current of the photovoltaic, device is determined by short circuit current of the unit cell which is farthest from the light incident side among the unit cells of the photovoltaic device. Even though the photovoltaic device having its short circuit current determined by the short circuit current of the unit cell which is farthest from the light incident side has high temperature coefficient (i.e., an efficiency deterioration rate of the photovoltaic device according to a temperature rise by 1° C.), it has low degradation ratio. Since the photovoltaic device installed in a low temperature region is relatively less affected by the temperature coefficient, the photovoltaic device is designed such that the short circuit current of the photovoltaic device is determined by the short circuit current of the unit cell which is farthest from the light incident side.

A rated output (efficiency) of the photovoltaic device designed in this manner is measured indoors under standard test conditions (hereinafter, referred to as STC). The set of STC consists of the followings.

AM 1.5 (AIR MASS 1.5)
Irradiance: 1000 $W \cdot m^{-2}$
Photovoltaic cell Temperature: 25° C.

However, when a photovoltaic device is installed outdoors, it happens that the temperature of the photovoltaic device is higher than 25° C. In this case, due to the temperature coefficient of the photovoltaic device, the efficiency of the photovoltaic device becomes lower than the rated efficiency of the photovoltaic device measured under the STC.

That is, when the photovoltaic device is operating, most of light energy absorbed by the photovoltaic device is converted into heat energy. An actual operating temperature of the photovoltaic device hereby easily becomes higher than 25° C. (i.e., the photovoltaic cell temperature under the STC). Accordingly, the temperature coefficient of the photovoltaic device causes the efficiency of the photovoltaic device to be lower than the rated efficiency of the photovoltaic device measured under the STC.

Because of such problems, when current matching design in the photovoltaic device having a tandem structure is performed on the basis of 25° C. (i.e., the photovoltaic cell temperature of the STC without considering the actual operating temperature of the photovoltaic device in an external environment, the photovoltaic device may not achieve a desired efficiency).

Accordingly, current matching design of the photovoltaic device according to the embodiment of the present invention is performed under nominal operating cell temperature obtained in a standard reference environment which is similar to the actual condition under which the photovoltaic device is installed. The set of standard reference environment includes the followings.

Tilt angle of photovoltaic device: 45° from the horizon
Total irradiance: 800 W·m$^{-2}$
Circumstance temperature: 20° C.
Wind speed: 1 m·s$^{-1}$
Electric load: none (open state)

The normal operating cell temperature corresponds to a temperature at which the photovoltaic device mounted on an open rack operates under the standard reference environment. The photovoltaic device is used in a variety of actual environments. Therefore, when designing the current matching of the photovoltaic device having a tandem structure performed under nominal operating cell temperature measured in the standard reference environment which is similar to the condition under the photovoltaic device is actually installed, it is possible to manufacture the photovoltaic device suitable for the actual installation environment. By controlling the thicknesses and optical band gaps of the i-type photoelectric conversion layers of the first unit cell 230 and the second unit cells 260 such that the short circuit currents of the first unit cell 230 and the second unit cell 260 are controlled, the efficiency of the photovoltaic device may be enhanced.

For this reason, in the embodiment of the present invention, when the nominal operating cell temperature of the photovoltaic device is equal to or more than 35 degrees Celsius, the thickness and optical band gap of the i-type photoelectric conversion layer of one unit cell which is closest to the light incident side between the first unit cell 230 and the second unit cell 260 is set such that the short circuit current of the one unit cell is equal to or less than that of the other unit cell. As a result, the short circuit current of the photovoltaic device according to the embodiment of the present invention is determined by the short circuit current of the unit cell which is closest to the light incident side.

As such, when the short circuit current of one unit cell which is closest to the light incident side is equal to or less than that of the other unit cell, the temperature coefficient becomes smaller. Therefore, although the actual temperature of the photovoltaic device becomes higher, electricity generation performance decrease due to the efficiency degradation is reduced. For example, when the photovoltaic device designed for making the short circuit current of one unit cell which is closest to the light incident side to be equal to or less than the short circuit current of the other unit cell is installed in a region having high temperature or strong ultraviolet rays of sunlight including intensive short wavelength rays in a blue-color range, the temperature coefficient is small. Therefore, although the actual temperature of the photovoltaic device becomes higher, the electricity generation performance decrease due to the efficiency degradation is reduced.

Contrary to this, when the nominal operating cell temperature of the photovoltaic device is less than and not equal to 35 degrees Celsius, the thicknesses and optical band gap of the i-type photoelectric conversion layer of one unit cell which is farthest from the light incident side between the first unit cell 230 and the second unit cell 260 is set such that the short circuit current of the other unit cell which is closest to the light incident side is equal to or less than that of the one unit cell. In other words, when the nominal operating cell temperature of the photovoltaic device is less than and not equal to 35 degrees Celsius, the thickness and optical band gap of the i-type photoelectric conversion layer of one unit cell which is closest to the light incident side among the first unit cell 230 and the second unit cell 260 is determined such that the short circuit current of the other unit cell is equal to or more than that of the one unit cell.

A resulting short circuit current of the photovoltaic device according to the embodiment of the present invention is hereby determined by the short circuit current of the unit cell which is farthest from the light incident side between the first unit cell and the second unit cell. In this case, even though temperature coefficient of the photovoltaic device is high, degradation ratio of the photovoltaic device is reduced. Since the actual operating temperature of the photovoltaic device is relatively low, the electricity generation performance may be improved in that the performance improvement due to the low degradation ratio may overtake the performance deterioration due to the high temperature coefficient. Particularly, because the deterioration rate in till factor is small, the photovoltaic device has an excellent outdoor electricity generation performance in an environment having a circumference temperature lower than 25° C. (i.e., the STC).

As described in the embodiment, regarding the photovoltaic device of which current matching design is performed under the nominal operating cell temperature, the short circuit current of the photovoltaic device can be measured under the STC.

The larger the thickness of the i-type photoelectric conversion layer is and the less the optical band gap of the i-type photoelectric conversion layer is, the bigger the short circuit current of the unit cell is. Accordingly, the short circuit current can be controlled by the determination of the thickness and the optical hand gap of the i-type photoelectric conversion layer.

The p-i-n type photovoltaic device on which light is incident in the direction from the first unit cell 230 formed on the substrate 100 to the second unit cell 260 has been described in the embodiment of the present invention. Moreover, the present invention may be applied to n-i-p type photovoltaic device on which light is incident from the opposite side to the substrate 10, that is, in the direction from the second unit cell 260 to the first unit cell 230.

In other words, light is incident on the n-i-p type photovoltaic device from the side of the second unit cell 260 opposite side to the substrate 100, that is, in the direction from the second unit cell 260 to the first unit cell 230. A first unit cell 230 including sequentially stacked n-type semiconductor layer, i-type intrinsic semiconductor layer and p-type semiconductor layer is formed on a first electrode 210. An intermediate reflector 250a and 250b is formed on the first unit cell 230. A second unit cell 260 including sequentially stacked n-type semiconductor layer, i-type intrinsic semiconductor layer and p-type semiconductor layer is formed on the intermediate reflector 250a and 250b.

The foregoing embodiments and advantages are merely exemplary and are not to he construed as limiting the present invention. The present teaching can he readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A photovoltaic device comprising:
a first electrode disposed on a substrate;
a first unit cell disposed on the first electrode and configured to convert light into electricity;
an intermediate reflector disposed on the first unit cell, the intermediate reflector comprising embedded metallic nanoparticles; and
a second unit cell disposed on the intermediate reflector and configured to convert light into electricity,
wherein a diameter of the metallic nanoparticles is equal to or greater than 5 nm and equal to or less than 100 nm,
wherein a plane fill factor of the metallic nanoparticles is equal to or greater than 0.1% and equal to or less than 10%, and
wherein surfaces of the metallic nanoparticles are covered by an oxide film or a nitride film, and a number of the metallic nanoparticles disposed at a center portion of the intermediate reflector is greater than a number of the metallic nanoparticles disposed at a surface of the intermediate reflector.

2. The photovoltaic device according to claim 1, wherein the first unit cell and the second unit cell comprise a p-type semiconductor layer, an intrinsic semiconductor layer and an n-type semiconductor layer.

3. The photovoltaic device according to claim 1, wherein the intermediate reflector comprises a metal oxide film, an oxide film, a nitride film or a carbon alloy which has the embedded metallic nanoparticles.

4. The photovoltaic device according to claim 1, wherein the metallic nanoparticles comprise at least one of Au, Ag, Al, Pt, Cu, Ni, Cr, Zn, Ti and Sn.

5. The photovoltaic device according to claim 1, wherein a refractive index of the intermediate reflector is equal to or more than 1.7 and equal to or less than 2.2 in a wavelength range from 500 nm to 700 nm.

6. The photovoltaic device according to claim 1, wherein the intermediate reflector is doped with impurities.

7. The photovoltaic device according to claim 1, wherein the intermediate reflector includes a hydrogenated n-type silicon oxide, a hydrogenated n-type silicon carbide or a hydrogenated n-type silicon nitride.

8. The photovoltaic device according to claim 1, wherein the intermediate reflector includes a hydrogenated n-type nanocrystalline silicon oxide, a hydrogenated n-type nanocrystalline silicon carbide or a hydrogenated n-type nanocrystalline silicon nitride.

9. The photovoltaic device according to claim 1, wherein a thickness of the intermediate reflector is equal to or more than 30 nm and equal to or less than 2000 nm.

10. The photovoltaic device according to claim 1, wherein a short circuit current of one unit cell which is closest to the light incident side between the first unit cell and the second unit cell is equal to or less than that of the other unit cell.

11. The photovoltaic device of claim 1, wherein a short circuit current of one unit cell which is closest to the light incident side between the first unit cell and the second unit cell is equal to or more than that of the other unit cell.

12. A photovoltaic device comprising:
a first electrode disposed on a substrate;
a first unit cell disposed on the first electrode and configured to convert light into electricity;
an intermediate reflector disposed on the first unit cell, the intermediate reflector comprising embedded metallic nanoparticles such that surface plasmon resonance occurs and so light intensity can be enhanced when light is incident on the metallic nanoparticles; and
a second unit cell disposed on the intermediate reflector and configured to convert light into electricity,
wherein a diameter of the metallic nanoparticles is equal to or greater than 5 nm and equal to or less than 100 nm,
wherein a plane fill factor of the metallic nanoparticles is equal to or greater than 0.1% and equal to or less than 10%, and
wherein surfaces of the metallic nanoparticles are covered by an oxide film or a nitride film, and a number of the metallic nanoparticles disposed at a center portion of the intermediate reflector is greater than a number of the metallic nanoparticles disposed at a surface of the intermediate reflector.

13. The photovoltaic device according to claim 12 wherein the intermediate reflector is formed of a metal oxide film, an oxide film, a nitride film, or a carbon alloy which has the embedded metallic nanoparticles.

14. The photovoltaic device according to claim 12, wherein the metallic nanoparticles comprise at least one of Au, Ag, Al, Pt, Cu, Ni, Cr, Zn, Ti and Sn.

15. The photovoltaic device according to claim 12, wherein a refractive index of the intermediate reflector is equal to or more than 1.7 and equal to or less than 2.2 in a wavelength range from 500 nm to 700 nm.

16. The photovoltaic device according to claim 12, wherein the first unit cell and the second unit cell comprises a conversion layer, and each conversion layer is configured with a thickness and an optical band gap such that the short circuit current of one of the first unit cell and the second unit cell is different than that of the other.

17. A photovoltaic device comprising:
a first electrode disposed on a substrate;
a first unit cell disposed on the first electrode and configured to convert light into electricity;
an intermediate reflector disposed on the first unit cell, the intermediate reflector comprising embedded metallic nanoparticles; and
a second unit cell disposed on the intermediate reflector and configured to convert light into electricity,
wherein a diameter of the metallic nanoparticles is equal to or greater than 5 nm and equal to or less than 100 nm,
wherein the metallic nanoparticles comprise platinum, and
wherein surfaces of the metallic nanoparticles are covered by an oxide film or a nitride film, and a number of the metallic nanoparticles disposed at a center portion of the intermediate reflector is greater than a number of the metallic nanoparticles disposed at a surface of the intermediate reflector.

18. The photovoltaic device of claim 1, wherein the intermediate reflector is doped with one of n-type or p-type impurities.

19. The photovoltaic device of claim 12, wherein the intermediate reflector is doped with one of n-type or p-type impurities.

* * * * *